United States Patent
Nakanishi et al.

(10) Patent No.: US 10,290,727 B2
(45) Date of Patent: May 14, 2019

(54) SEMICONDUCTOR DEVICE STRUCTURE FOR INSULATED GATE BIPOLAR TRANSISTOR

(71) Applicant: RENESAS ELECTRONICS CORPORATION, Tokyo (JP)

(72) Inventors: Sho Nakanishi, Ibaraki (JP); Yuji Fujii, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 54 days.

(21) Appl. No.: 15/404,509

(22) Filed: Jan. 12, 2017

(65) Prior Publication Data
US 2017/0207331 A1 Jul. 20, 2017

(30) Foreign Application Priority Data
Jan. 18, 2016 (JP) .................. 2016-006857

(51) Int. Cl.
| | |
|---|---|
| *H01L 29/739* | (2006.01) |
| *H01L 21/04* | (2006.01) |
| *H01L 29/45* | (2006.01) |
| *H01L 21/265* | (2006.01) |
| *H01L 23/535* | (2006.01) |

(Continued)

(52) U.S. Cl.
CPC ........ *H01L 29/7397* (2013.01); *H01L 21/043* (2013.01); *H01L 21/0485* (2013.01); *H01L 21/265* (2013.01); *H01L 21/28518* (2013.01); *H01L 23/535* (2013.01); *H01L 27/0635* (2013.01); *H01L 29/083* (2013.01); *H01L 29/0834* (2013.01); *H01L 29/36* (2013.01); *H01L 29/417* (2013.01); *H01L 29/45* (2013.01); *H01L 29/456* (2013.01); *H01L 29/66348* (2013.01)

(58) Field of Classification Search
CPC ... H01L 29/7397; H01L 29/083; H01L 29/36; H01L 29/66348; H01L 21/043; H01L 21/0485; H01L 29/45
See application file for complete search history.

(56) References Cited

U.S. PATENT DOCUMENTS

| | | | | |
|---|---|---|---|---|
| 2011/0031507 A1* | 2/2011 | Tamaso | ............... | H01L 21/0485 257/77 |
| 2011/0180902 A1* | 7/2011 | Inagawa | ............. | H01L 29/0696 257/577 |

(Continued)

FOREIGN PATENT DOCUMENTS

JP 2013-145851 A 7/2013

*Primary Examiner* — Feifei Yeung Lopez
(74) *Attorney, Agent, or Firm* — McDermott Will & Emery LLP

(57) ABSTRACT

A performance of a semiconductor device including an RC-IGBT is improved. An AlNiSi layer (a layer containing aluminum (Al), nickel (Ni), and silicon (Si)) is formed between a back surface of a semiconductor substrate and a back surface electrode. Thus, a favorable ohmic junction can be obtained between the back surface electrode and an $N^+$-type layer constituting a cathode region in an embedded diode, and a favorable ohmic junction can be obtained between the back surface electrode and a P-type layer constituting a collector region in an IGBT. The AlNiSi layer contains 10 at % or more of each of the aluminum (Al), the nickel (Ni), and the silicon (Si).

9 Claims, 18 Drawing Sheets

(51) Int. Cl.
*H01L 27/06* (2006.01)
*H01L 29/08* (2006.01)
*H01L 29/36* (2006.01)
*H01L 29/66* (2006.01)
*H01L 29/417* (2006.01)
*H01L 21/285* (2006.01)

(56) References Cited

U.S. PATENT DOCUMENTS

2013/0181254 A1   7/2013  Iwasaki
2015/0155277 A1*  6/2015  Ogura ................ H01L 27/0761
                                                           257/140
2015/0287597 A1*  10/2015  Kitabayashi ...... H01L 29/66068
                                                            438/602

* cited by examiner

SEMICONDUCTOR DEVICE STRUCTURE FOR INSULATED GATE BIPOLAR TRANSISTOR

CROSS-REFERENCE TO RELATED APPLICATION

The present application claims priority from Japanese Patent Application No. 2016-006857 filed on Jan. 18, 2016, the content of which is hereby incorporated by reference into this application.

TECHNICAL FIELD OF THE INVENTION

The present invention relates to a semiconductor device and a technique for manufacturing the same, and is preferably used for, for example, a semiconductor device including a diode and an Insulated Gate Bipolar Transistor (IGBT).

BACKGROUND OF THE INVENTION

Japanese Patent Application Laid-Open No. 2013-145851 (Patent Document 1) describes a semiconductor device in which a cathode region of a diode and a collector region of an IGBT are formed in an area exposed to one surface of a semiconductor substrate, in which a first conductor layer contacting the cathode region and a second conductor layer contacting the collector region are formed on the front surface, and in which a work function of the second conductor layer is larger than a work function of the first conductor layer.

SUMMARY OF THE INVENTION

In a Reverse Conducting IGBT (RC-IGBT), it is required to form an ohmic junction with back surface electrodes in both a back surface P-type layer and a back surface N-type layer which have been formed on a back surface of a semiconductor substrate. While a favorable ohmic junction can be formed by using, for example, a technique described in Patent Document 1, a technique capable of achieving a high-performance RC-IBGT using a simpler manufacturing process is desirable.

Other object and novel characteristics of the present invention will be apparent from the description of the present specification and the accompanying drawings.

A semiconductor device according to an embodiment includes: a semiconductor substrate having a front surface and aback surface: a front surface electrode formed on the front surface side; and a back surface electrode formed on the back surface side. The semiconductor device further includes: aback surface P-type layer exposed to the back surface and formed in a first region of the semiconductor substrate; a back surface N-type layer exposed to the back surface and formed in a second region of the semiconductor substrate; a junction layer formed in contact with the back surface P-type layer and the back surface N-type layer and containing aluminum, nickel, and silicon; and the back surface electrode formed in contact with the junction layer.

A method of manufacturing a semiconductor device according to an embodiment includes the following steps of a step of forming a back surface P-type layer exposed to a back surface of the semiconductor substrate by ion-implanting P-type impurities into a first region on the back surface of the semiconductor substrate, a step of forming a back surface N-type layer exposed to the back surface of the semiconductor substrate by ion-implanting N-type impurities into a second region on the back surface of the semiconductor substrate, a step of forming an aluminum alloy film containing silicon on the back surface of the semiconductor substrate, a step of forming a nickel film on the aluminum alloy film containing silicon, a step of forming a junction layer containing aluminum, nickel, and silicon contacting the back surface of the semiconductor substrate by irradiating a stacked film formed of the aluminum alloy film containing silicon and the nickel film with a laser beam, and a step of forming a back surface electrode in contact with the junction layer.

According to an embodiment, a performance of a semiconductor device including an RC-IGBT can be improved.

BRIEF DESCRIPTIONS OF THE DRAWINGS

Figure 3A:
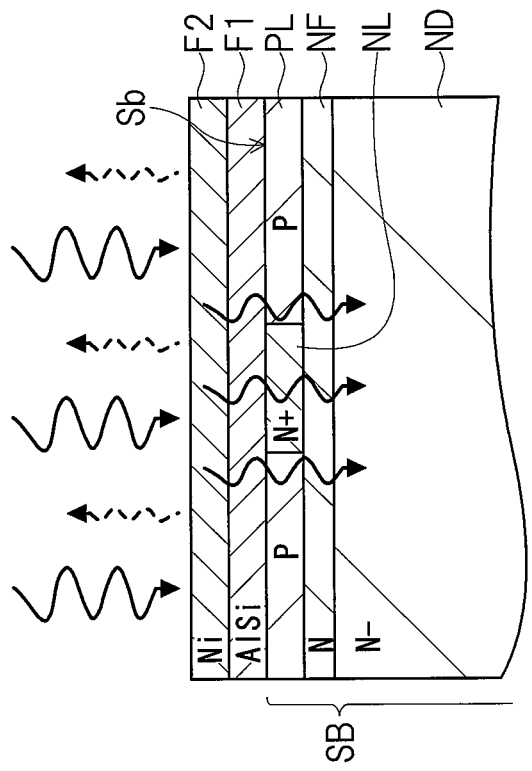
Figure 3B:
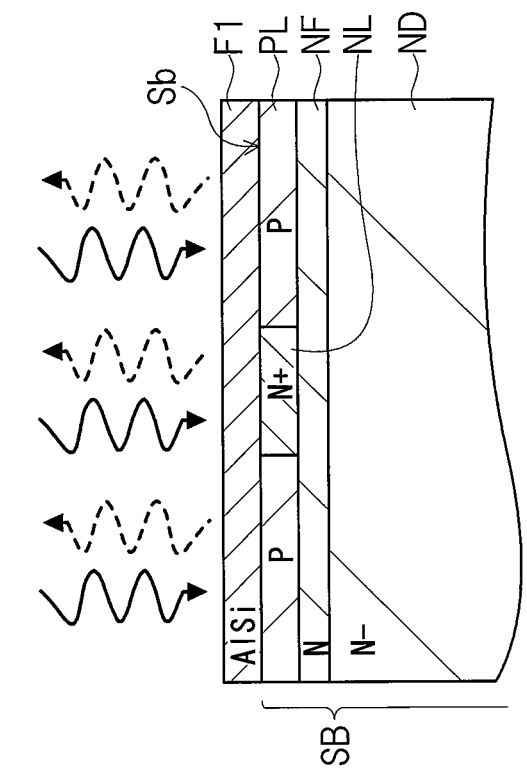
Figure 4:
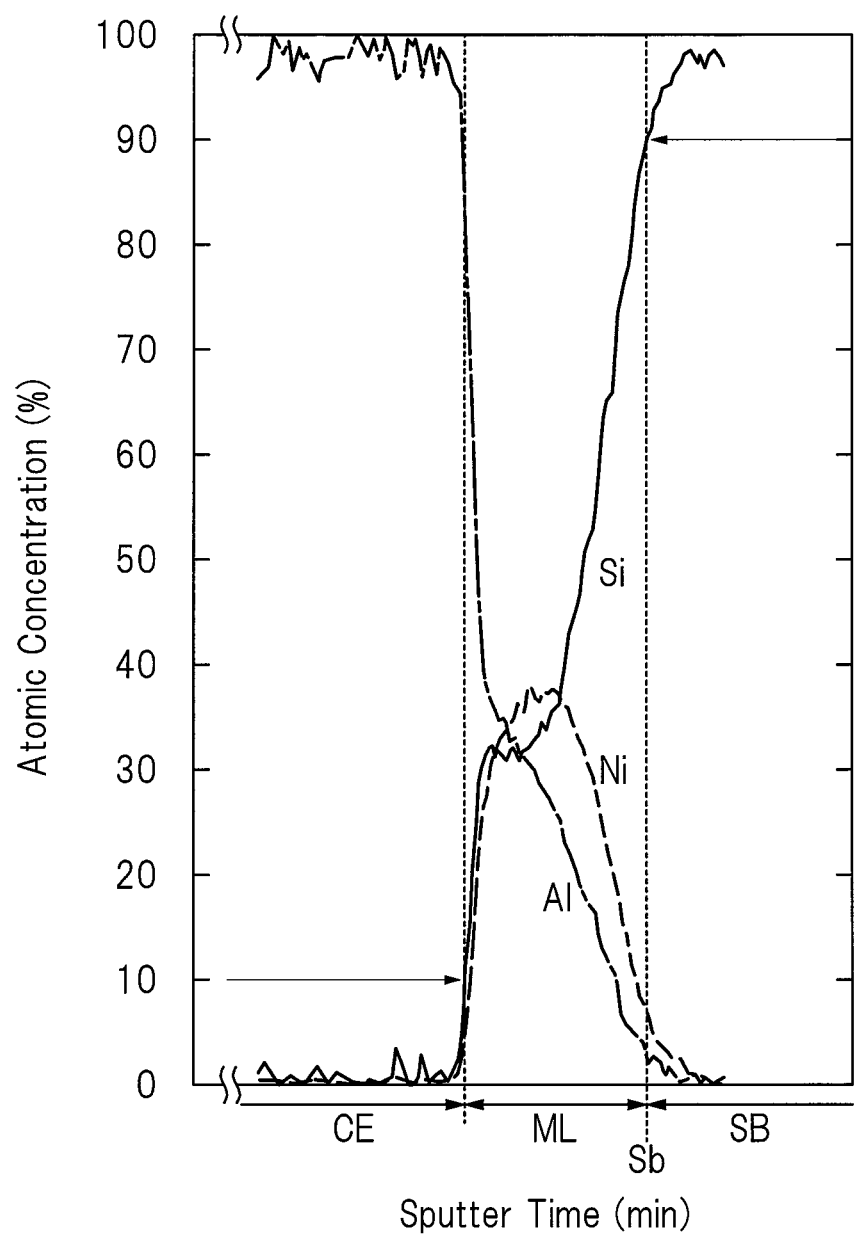
Figure 5:
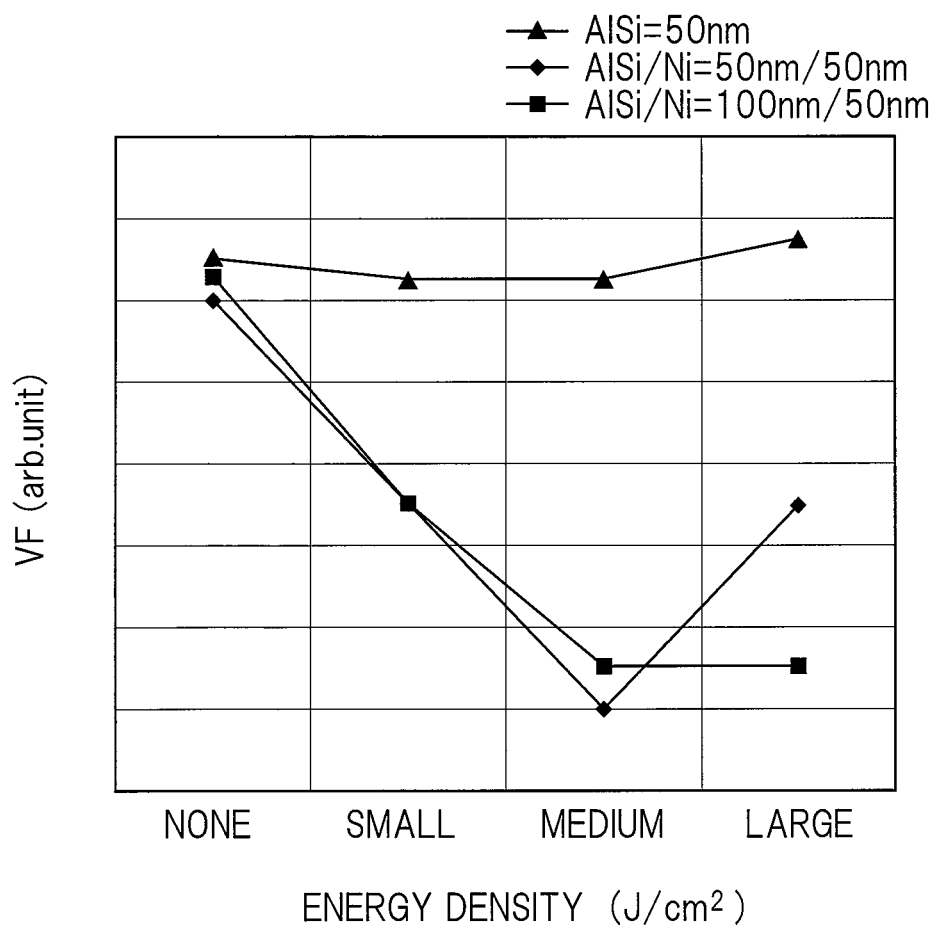
Figure 6:
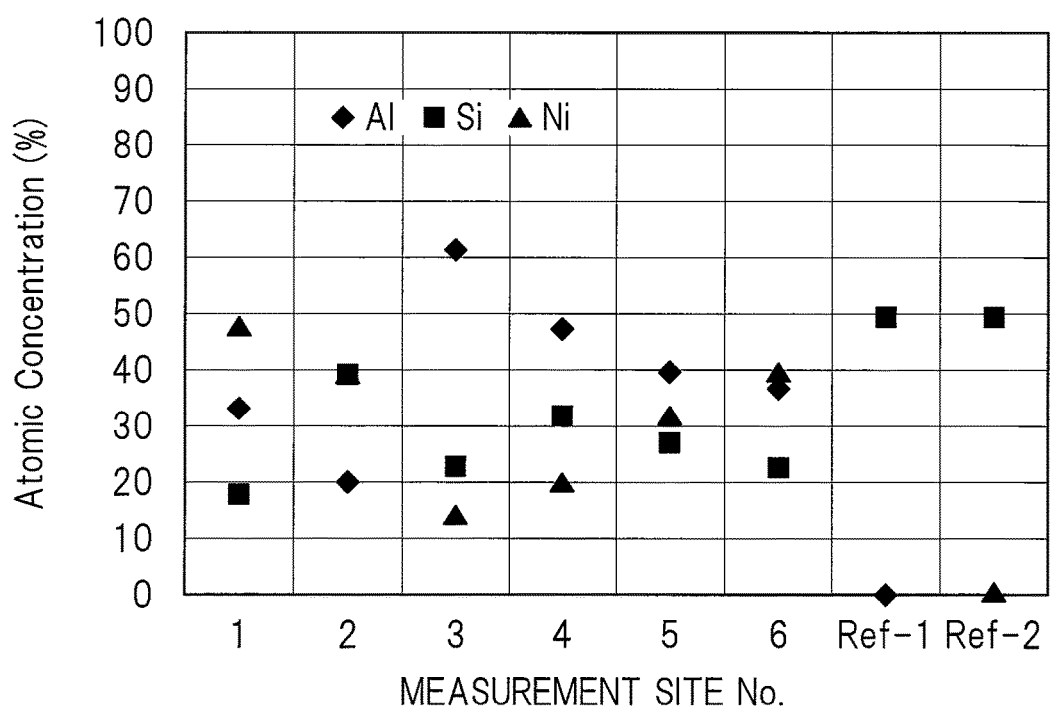
Figure 7:
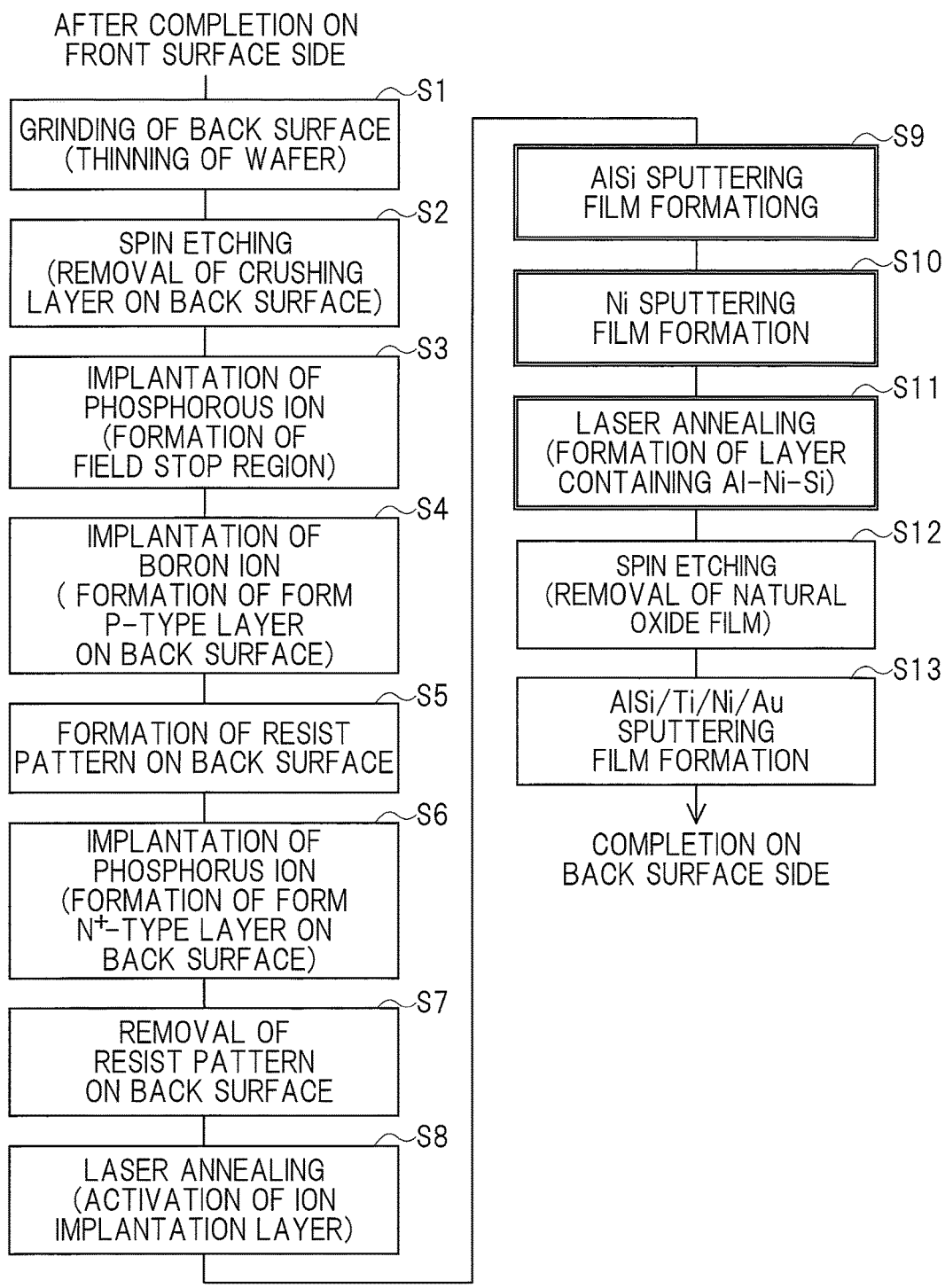
Figure 8:
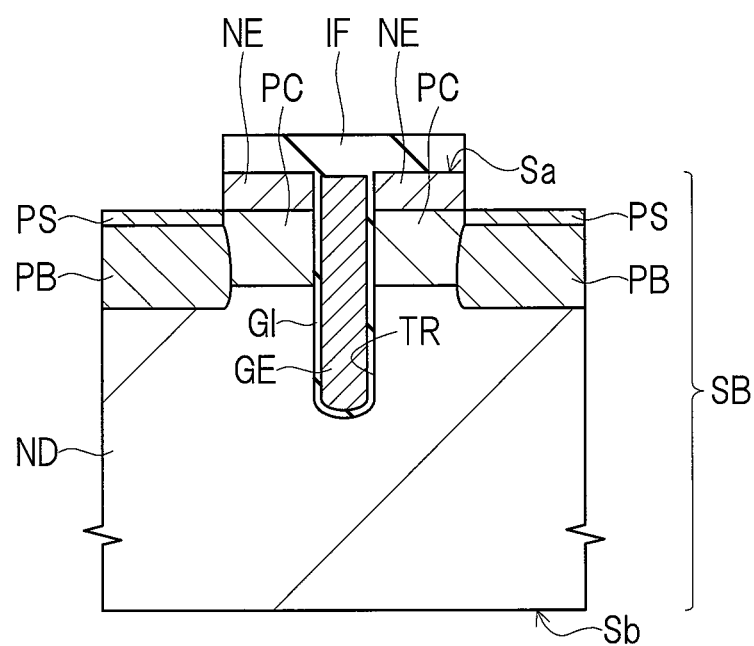
Figure 9:
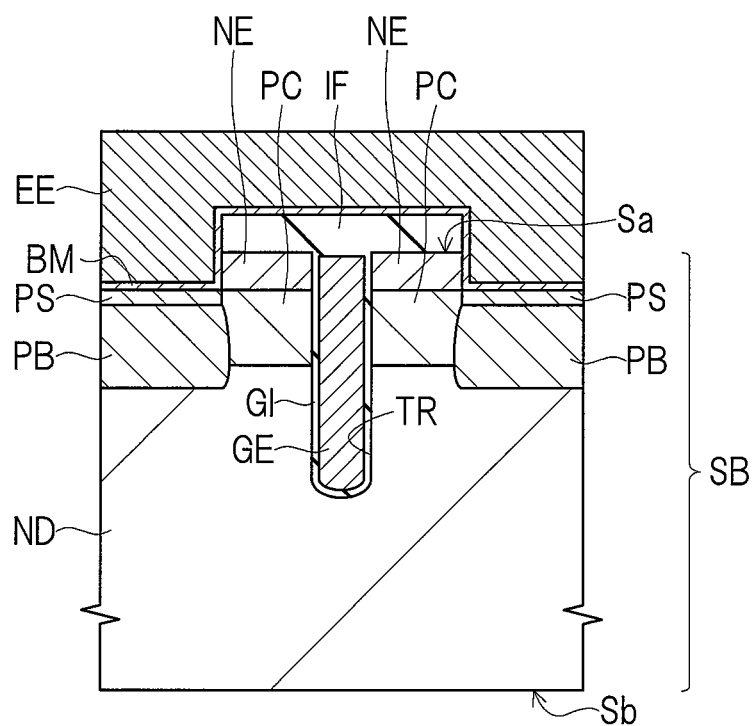
Figure 10:
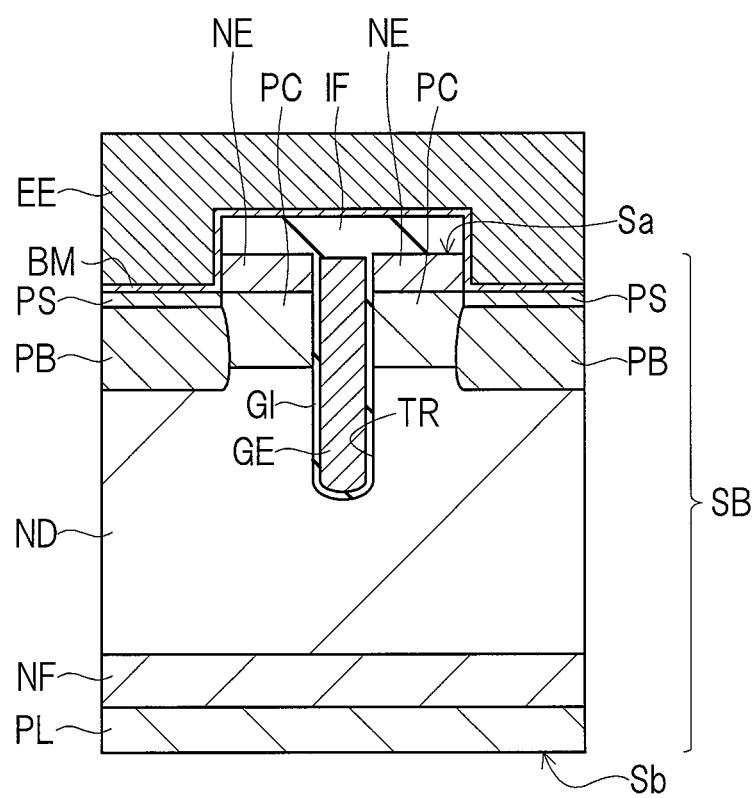
Figure 11:
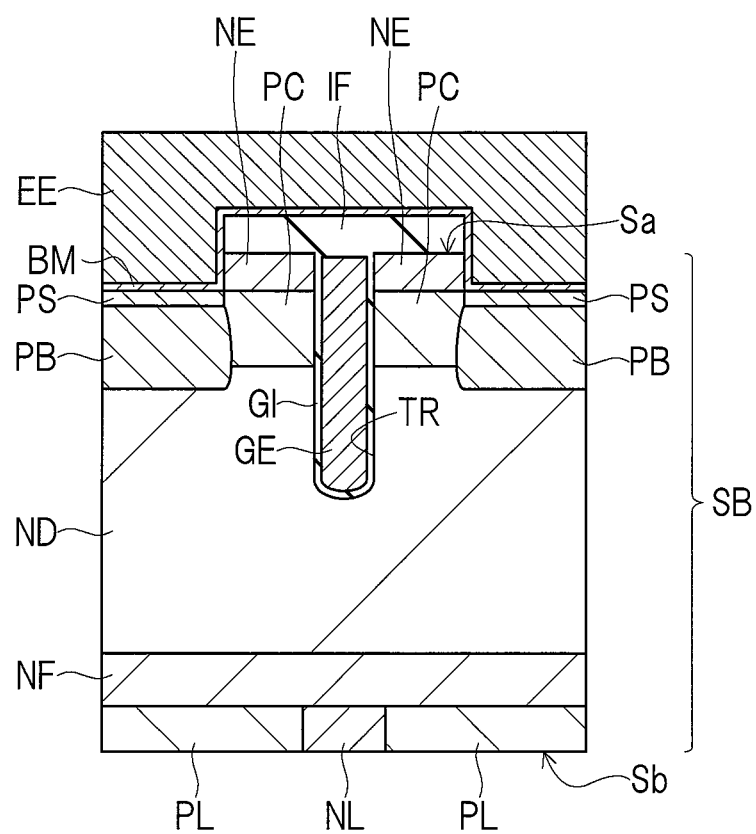
Figure 12:
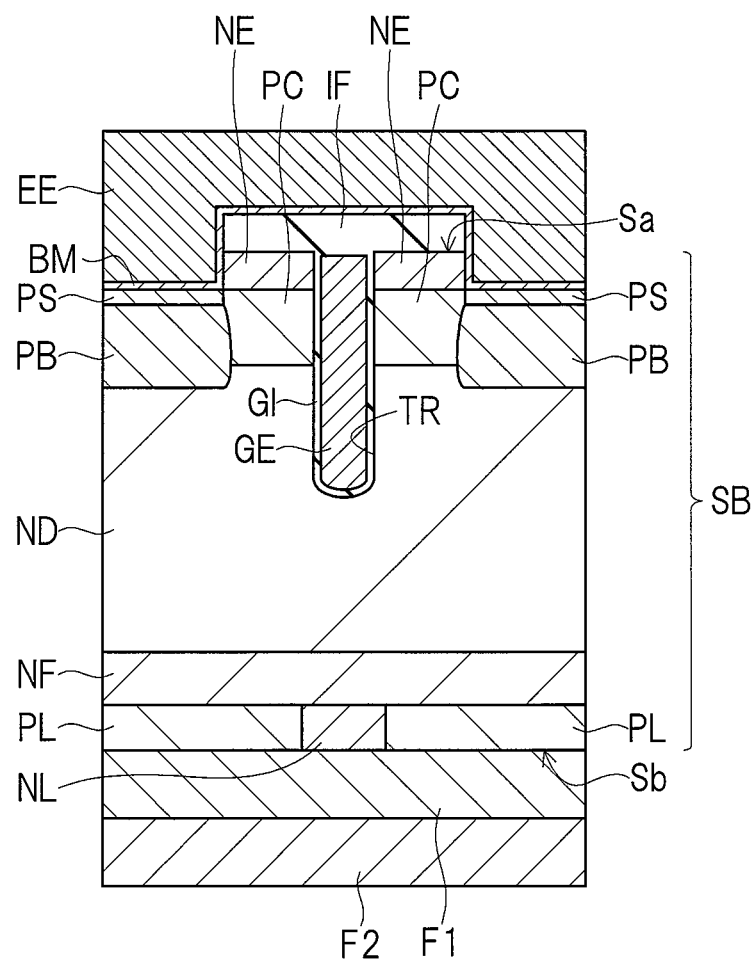
Figure 13:
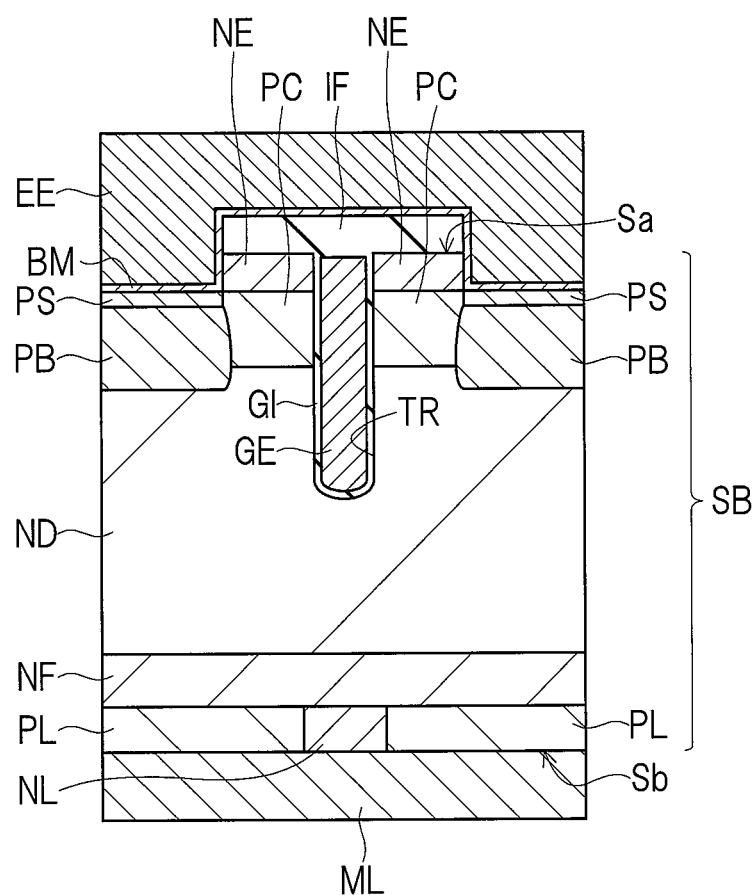
Figure 14:
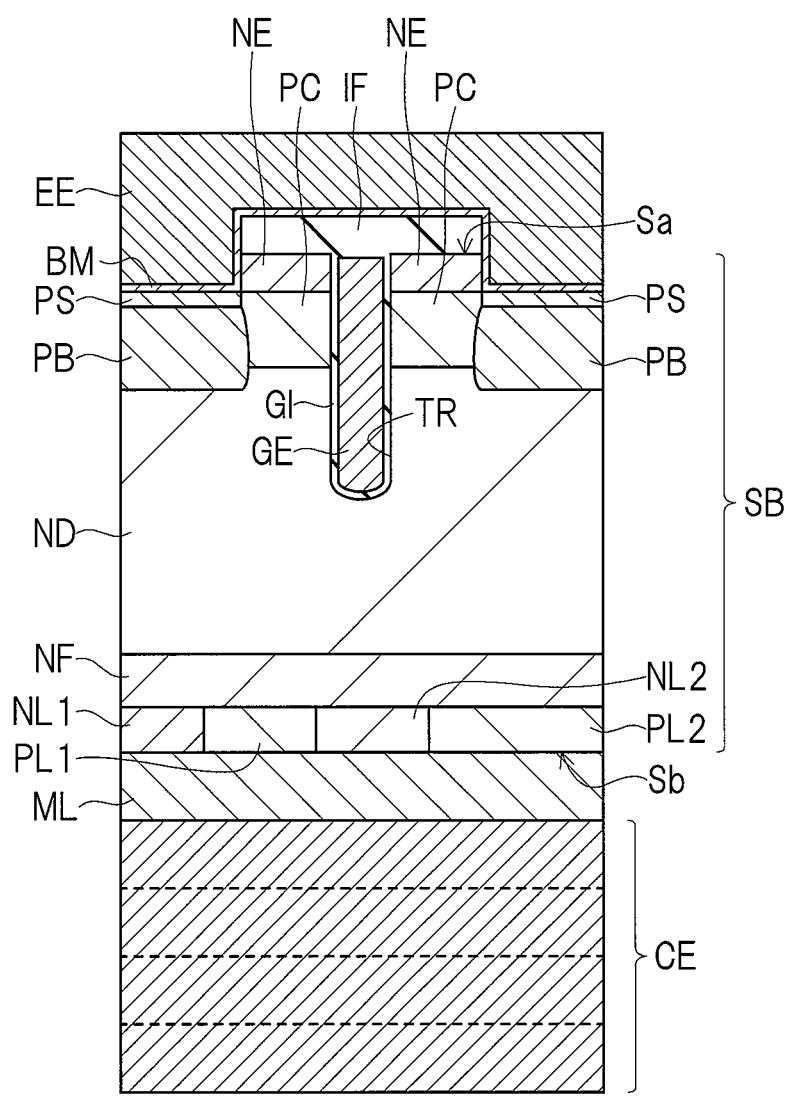
Figure 15:
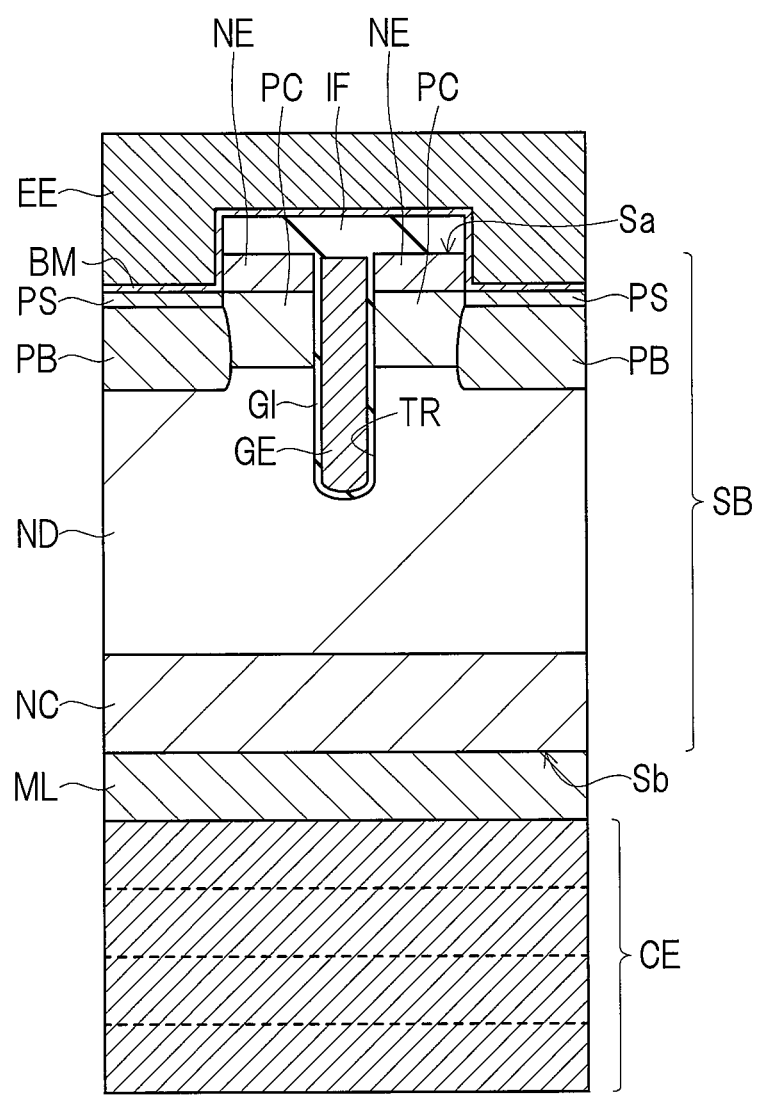
Figure 16:
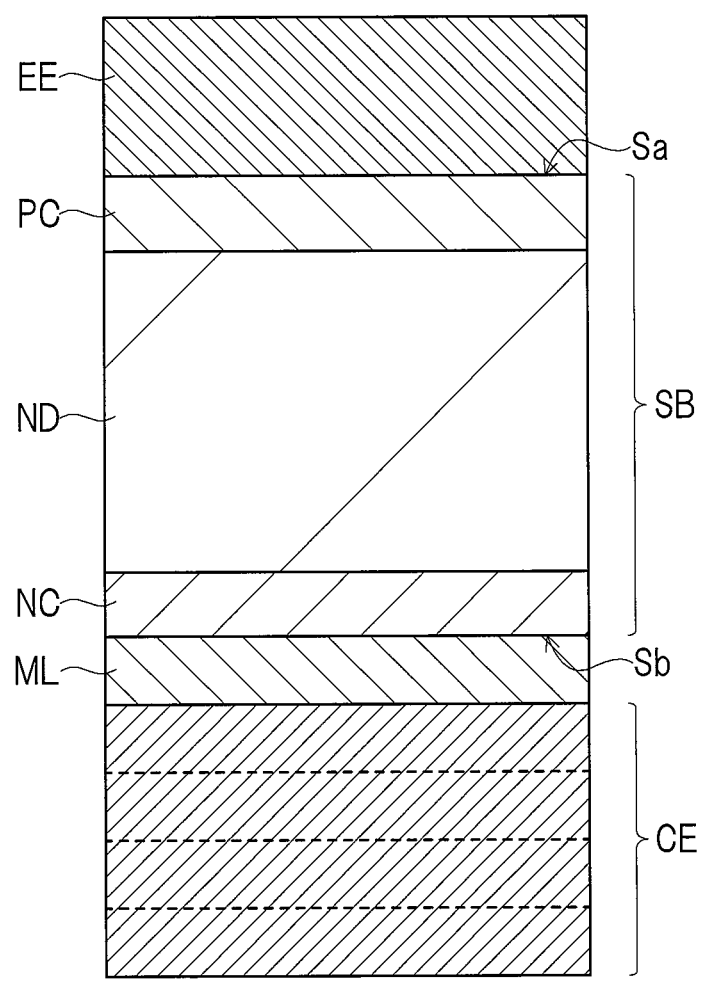
Figure 17A:
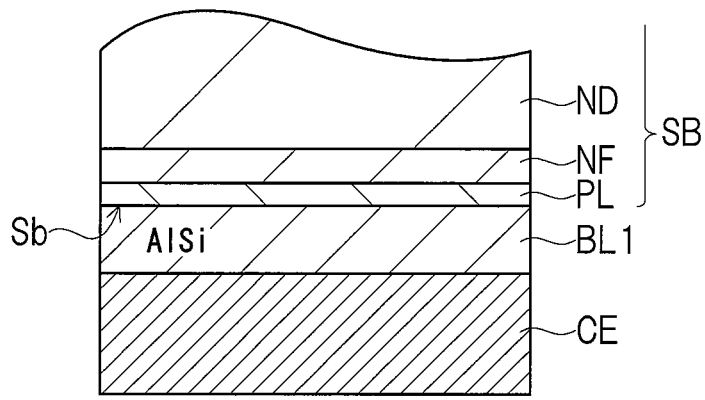
Figure 17B:
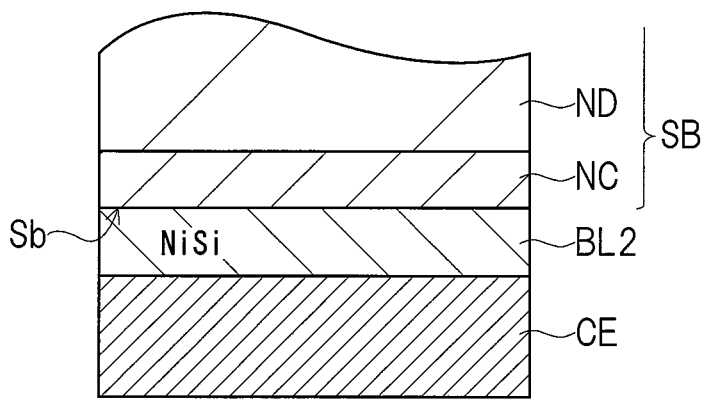
Figure 18:
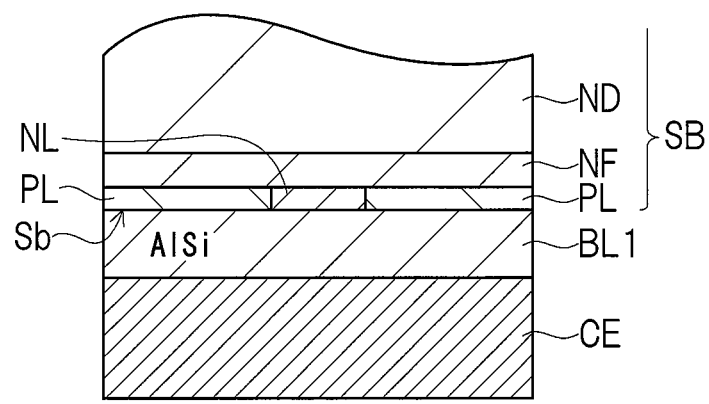

FIGS. 3A and 3B are a schematic view explaining a heat generation state on the back surface of the semiconductor substrate caused when an aluminum alloy film containing silicon is subjected to a laser annealing process and a schematic view explaining a heat generation state on the back surface of the semiconductor substrate when a stacked film of an aluminum alloy film containing silicon/a nickel film is subjected to a laser annealing process, respectively;

FIG. 4 is an analysis diagram of Auger Electron Spectroscopy on the back surface of the semiconductor substrate which has been subjected to a laser annealing process;

FIG. 5 is a graph illustrating a relation between a forward voltage drop (VF) of an embedded diode and an energy density for a laser annealing process;

FIG. 6 is a graph illustrating an atomic percent (at %) of each of aluminum, nickel, and silicon contained in a layer containing aluminum, nickel, and silicon according to the embodiment;

FIG. 7 is a flowchart illustrating processes for manufacturing the RC-IGBT according to the embodiment;

FIG. 8 is a cross-sectional view illustrating processes for manufacturing the RC-IGBT according to the embodiment;

FIG. 9 is a cross-sectional view illustrating processes for manufacturing the RC-IGBT according to the embodiment, continued from FIG. 8;

FIG. 10 is a cross-sectional view illustrating processes for manufacturing the RC-IGBT according to the embodiment, continued from FIG. 9;

FIG. 11 is a cross-sectional view illustrating processes for manufacturing the RC-IGBT according to the embodiment, continued from FIG. 10;

FIG. 12 is a cross-sectional view illustrating processes for manufacturing the RC-IGBT according to the embodiment, continued from FIG. 11;

FIG. 13 is a cross-sectional view illustrating processes for manufacturing the RC-IGBT according to the embodiment, continued from FIG. 12;

FIG. 14 is a cross-sectional view of an RC-IGBT according to a first modification example of an embodiment;

FIG. 15 is a cross-sectional view of a power MOSFET according to a second modification example of an embodiment;

FIG. 16 is a cross-sectional view of a diode according to a third modification example of an embodiment;

FIGS. 17A and 17B are a cross-sectional view illustrating a structure of an IGBT on a collector electrode side and a cross-sectional view illustrating a structure of a diode on a cathode electrode side, respectively; and FIG. 18 is a cross-sectional view illustrating a structure of an RC-IGBT which has been studied by the present inventors, on a back surface electrode side.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, an application example, detail explanation, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the above-described numerical value or others (including the number of pieces, the numerical value, the amount, the range, and others).

Hereinafter, embodiments will be described in detail with reference to the accompanying drawings. Note that components having the same function are denoted by the same reference symbols throughout all the drawings for describing the embodiment, and the repetitive description thereof will be omitted. Also, when there are a plurality of similar members (portions), an individual or specific portion may be shown by adding a symbol to a reference character of a generic name in some cases. Also, in the following embodiments, the description of the same or similar portions is not repeated unless it is particularly required.

Also, in some drawings used in the embodiments, hatching is omitted even in a cross-sectional view so as to make the drawings easy to see in some cases. Also, hatching is used even in a plan view so as to make the drawings easy to see in some cases.

Also, in the cross-sectional view and the plan view, a size of each portion does not correspond to that of the practical device, and the specific portion may be illustrated to be relatively large in order to easily understand the drawings in some cases. Also, even in the cross-sectional view and the plan view corresponding thereto, the specific portion may be illustrated to be relatively large in order to easily understand the drawings in some cases.

Characters "−" and "+" used here are symbols each indicating a relative impurity concentration of an N- or P-conductivity type. For example, the impurity concentrations of N-type impurities increase in an order of "N−", "N", and "N+", and the impurity concentrations of P-type impurities increase in an order of "P−", "P" "P+", and "P++".

Detailed Description of Problem

First, since a structure of an RC-IGBT according to the present embodiment is considered to be made clearer, a malfunction occurring in the RC-IGBT found out by the present inventors will be described below by using FIGS. 17A, 17B and 18. FIGS. 17A and 17B are a cross-sectional view illustrating a structure of an IGBT on a collector electrode side and a cross-sectional view illustrating a structure of a diode on a cathode electrode side, respectively. FIG. 18 is a cross-sectional view illustrating a structure of the RC-IGBT studied so far by the present inventors on a back surface electrode side.

In the IGBT, as illustrated in FIG. 17A, an N−-type layer ND functioning as a drift region, an N-type layer NF functioning as a field stop region, and a P-type layer (an impurity concentration is, for example, about $1 \times 10^{17}$ cm$^{-3}$) PL functioning as a collector region are formed on a back surface Sb side of a semiconductor substrate SB.

In order to obtain a favorable ohmic junction with the P-type layer PL, for example, an aluminum (Al) alloy film containing silicon (Si) (hereinafter referred to as an AlSi film) BL1 is formed between the P-type layer PL and a back surface electrode CE as a junction layer. The AlSi film BL1 is formed by, for example, a sputtering method. Consequently, heat treatment is not required to form the AlSi film BL1, and the ohmic junction is formed without heat treatment being performed.

On the other hand, in the diode, as illustrated in FIG. 17B, an N−-type layer ND functioning as a drift region and an N+-type layer (an impurity concentration is, for example, about $1 \times 10^{20}$ cm$^{-3}$) NC functioning as a cathode region are formed on the back surface Sb side of the semiconductor substrate SB.

In order to obtain a favorable ohmic junction with the N+-type layer NC, for example, a nickel (Ni) silicide film (hereinafter referred to as an NiSi film) BL2 is formed as a junction layer between the N+-type layer NC and the back surface electrode CE. The NiSi film BL2 is formed by forming a nickel (Ni) film by, for example, a sputtering method, and then, performing heat treatment thereto at a temperature of about 400° C. to make a silicide form of the nickel (Ni) film.

In the RC-IGBT, as illustrated in FIG. 18, the P-type layer (an impurity concentration is, for example, about $1 \times 10^{17}$ cm$^{-3}$) PL and the N+-type layer (an impurity concentration is, for example, about $1 \times 10^{20}$ cm$^{-3}$) NL are formed on the back surface Sb side of the semiconductor substrate SB. The P-type layer PL functions as a collector region in the IGBT, and the N+-type layer NL functions as a cathode region in the embedded diode.

Since an operation property of the IGBT is emphasized, the AlSi film BL1 is generally formed between the back surface electrode CE and the P-type layer PL, the N+-type layer NL as a junction layer in order to obtain an ohmic junction with the back surface electrode CE.

However, in a state with usage of the AlSi film BL1 and without performing heat treatment, the ohmic junction is formed with the P-type layer PL while a schottky junction is formed with the N+-type layer NL. Thus, a problem of increase in a forward voltage drop (VF) of the embedded diode and increase in a conduction loss arises.

By performing the heat treatment even if the AlSi film BL1 is used, the ohmic junction with the N+-type layer NL can be formed. However, when silicon (Si) contained in the AlSi film BL1 is deposited by the heat treatment, which results in diffusion of aluminum (Al) into a deposited site, there is a risk of change of the type of the $N^+$-type layer NL into a P-type. If the type of the $N^+$-type layer NL is changed into a P-type, a contact resistance increases, and the forward voltage drop (VF) of the embedded diode increases.

Also, by performing the heat treatment, a spike of aluminum (Al) occurs, and therefore, there is a risk of increase in a breakdown voltage leakage current.

When heat treatment is performed to an entire semiconductor wafer, warpage of the semiconductor wafer increases, and therefore, there is a risk of increase in a breakdown voltage leakage current caused by a stress.

As described in Japanese Patent Application Laid-open No. 2013-145851 (Patent Document 1), electrode materials, which are different from each other in a work function, can also be used for the P-type layer PL and the $N^+$-type layer NL. For example, an aluminum (Al) alloy film (a work function: about 5.0 eV) containing silicon (Si) is formed for the P-type layer PL, and a titanium (Ti) film (a work function: about 4.33 eV) is formed for the $N^+$-type layer NL. However, manufacturing processes are complicated, and the titanium (Ti) film is peeled off, and therefore, there is a risk of decrease in reliability.

Thus, in the RC-IGBT, it is difficult to form the favorable ohmic junction between the back surface electrode CE and both the P-type layer PL and the $N^+$-type layer NL, which have been formed on the back surface Sb of the semiconductor substrate SB. Therefore, a technique for achieving a high-performance RC-IBGT using simple manufacturing processes has been desired.

The present embodiment will be described in detail below with reference to the drawings.

Embodiment

<<Configuration of RC-IGBT>>

Figure 1:
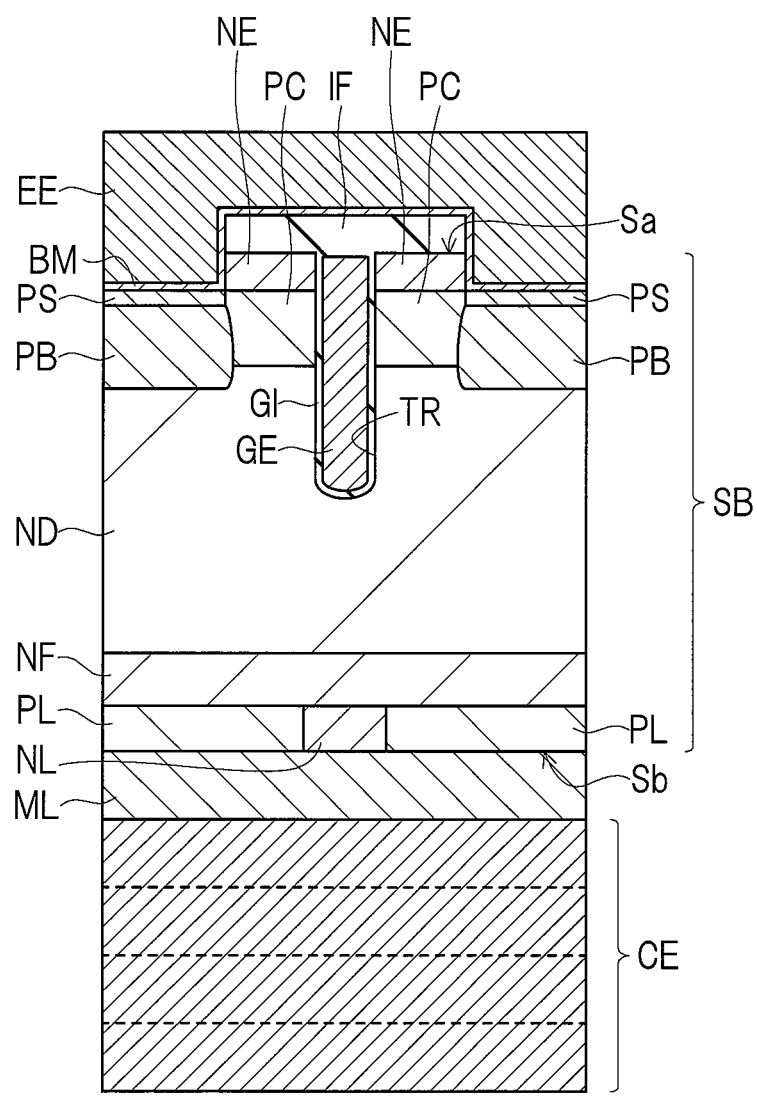
FIG. 1 is a cross-sectional view of an RC-IGBT according to an embodiment.
Figure 2:
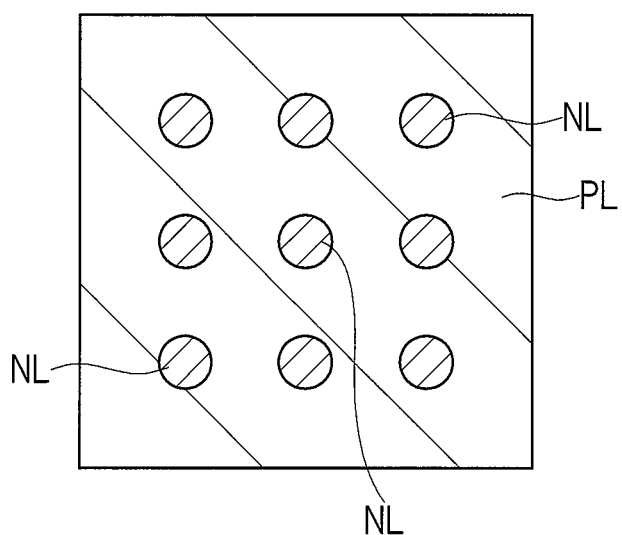
FIG. 2 is a plan view illustrating a part of a back surface of a semiconductor substrate in a region where the RC-IGBT according to the embodiment is formed.

A configuration of an RC-IGBT according to the present embodiment will be described with reference to FIGS. 1 and 2. FIG. 1 is a cross-sectional view of the RC-IGBT according to the present embodiment. FIG. 2 is a plan view illustrating a part of a back surface of a semiconductor substrate in a region where the RC-IGBT according to the present embodiment is formed.

The RC-IGBT is a semiconductor element in which a reflux diode is embedded in an IGBT.

In the RC-IGBT according to the present embodiment, the IGBT is formed by an emitter region (an $N^+$-type layer NE), a body region (a $P^+$-type layer PB and a P-type layer PC), a drift region (an $N^-$-type layer ND), a field stop region (an N-type layer NF), and a collector region (a P-type layer PL). The embedded diode is formed by a P-type region (the $P^+$-type layer PB and the P-type layer PC) and an N-type region (the $N^-$-type layer ND, the N-type layer NF, and an $N^+$-type layer NL) so as to be embedded in the IGBT.

As illustrated in FIG. 1, a semiconductor substrate SB is made of, for example, single crystalline silicon (Si), and has a front surface (an upper surface or a first main surface) Sa and a back surface (a lower surface or a second main surface) Sb on the opposite side to the front surface Sa. The $N^-$-type layer ND is formed in the semiconductor substrate SB. The $N^-$-type layer ND constitutes the drift region in the IGBT, and constitutes a drift region (a part of the N-type region) in the embedded diode.

A pair of $P^+$-type layers PB arranged in a transverse direction is formed in the semiconductor substrate SB closer to the front surface Sa than the $N^-$-type layer ND, and $P^{++}$-type layers PS are respectively formed in the semiconductor substrate SB immediately above the pair of $P^+$-type layers PB. Further, a pair of P-type layers PC is formed in the semiconductor substrate SB between the pair of $P^+$-type layers PB. The $P^+$-type layer PB and the P-type layer PC constitute the body region in the IGBT, and constitute the P-type region in the embedded diode. The $P^{++}$-type layer PS is a high-concentration semiconductor layer for reducing a resistance of connection to a front surface electrode EE electrically connected to the $P^+$-type layer PB, and the $P^{++}$-type layer PS is connected to the front surface electrode EE in ohmic-connection form.

$N^+$-type layers NE are respectively formed in the semiconductor substrate SB immediately above the pair of P-type layers PC. The $N^+$-type layer NE constitutes the emitter region in the IGBT.

One trench TR is formed between the pair of $N^+$-type layers NE and between the pair of P-type layers PC, and the trench TR reaches a depth in the middle of the $N^{--}$-type layer ND from the height of the upper surface of the $N^+$-type layer NE (the front surface Sa of the semiconductor substrate SB). Inside the trench TR, A gate electrode GE is formed through a gate insulating film GI.

The gate insulating film GI is made of, for example, silicon oxide ($SiO_2$), and the gate electrode GE is made of, for example, polycrystalline silicon (Si). The gate electrode GE is electrically insulated from the 1V-type layers NE, the P-type layers PC, and the $N^{--}$-type layer ND by the gate insulating film GI.

An insulating film IF is formed to cover an upper surface of the gate electrode GE and the upper surfaces of the $N^+$-type layers NE, and the front surface electrode EE is formed to cover the $P^{++}$-type layers PS, the $N^+$-type layers NE, and the insulating film IF through a barrier metal film BM.

The insulating film IF is made of, for example, silicon oxide ($SiO_2$), the barrier metal film BM is made of, for example, titanium-tungsten (TiW), and the front surface electrode EE is made of, for example, an aluminum (Al) alloy containing silicon (Si).

The barrier metal film BM contacts respective upper surfaces of the $P^{++}$-type layers PS and respective sidewalls of the $N^+$-type layers NE. Thus, the $P^{++}$-type layers PS and the $N^+$-type layers NE are electrically connected to the front surface electrode EE. The front surface electrode EE functions as an emitter electrode of the IGBT, and, at the same time, functions as an anode electrode of the embedded diode.

Furthermore, the N-type layer NF is formed in the semiconductor substrate SB on the back surface Sb side of the $N^-$-type layer ND. The N-type layer NF constitutes the field stop region in the IGBT, and constitutes the other part of the N-type region in the embedded diode. The P-type layer PL and the $N^+$-type layer NL are formed in the semiconductor substrate SB closer to the back surface Sb than the N-type layer NF. The P-type layer PL constitutes the collector region in the IGBT, and the $N^+$-type layer NL constitutes a cathode region (the other part of the N-type region) in the embedded diode. The impurity concentration of the P-type layer PL is, for example, about $1 \times 10^{17}$ $cm^{-3}$, and the impurity concentration of the $N^+$-type layer NL is, for example, about $1 \times 10^{20}$ $cm^{-3}$.

As illustrated in FIG. 2, the P-type layer PL is formed in a wide area of the back surface Sb of the semiconductor substrate SB, and a plurality of $N^+$-type layers NL are arranged to be lined in a matrix form. Each of the plurality of the formed N+-type layers NL has a circular shape in a plan view.

Furthermore, as illustrated in FIG. 1, a layer (hereinafter referred to as an AlNiSi layer) ML containing aluminum (Al), Ni (nickel), and silicon (Si) is formed in contact with respective lower surfaces of the P-type layer PL and the N+-type layer NL (the back surface Sb of the semiconductor substrate SB).

A thickness of the AlNiSi layer is, for example, about 100 to 500 nm, and a ratio of the number of elements of each of aluminum (Al), nickel (Ni), and silicon (Si) contained in the AlNiSi layer ML is 10 at % or more. Here, the thickness of the AlNiSi layer ML means an area where a content of silicon (Si) contained in the AlNiSi layer ML is 10% or more and 90% or less (see FIG. 4 described later). Therefore, in the area where the content of silicon (Si) is 10% or more and 90% or less, the ratio of the number of elements of each of aluminum (Al), nickel (Ni), and silicon (Si) is 10 at % or more.

Furthermore, a back surface electrode CE is formed in contact with the AlNiSi layer ML. When the AlNiSi layer ML is formed as a junction layer between the P-type layer PL and the N+-type layer NL, so that the P-type layer PL and the N+-type layer NL are connected to the back surface electrode CE in the ohmic connection.

The back surface electrode CE functions as a collector electrode of the IGBT, and, at the same time, functions as a cathode electrode of the embedded diode. As the back surface electrode CE, a structure can be exemplified, the structure obtained by sequentially stacking an aluminum (Al) alloy film containing silicon (Si), a titanium (Ti) film, a nickel (Ni) film, and a gold (Au) film from the back surface Sb side of the semiconductor substrate SB.

Note that, while the AlNiSi layer ML is formed in order to form the ohmic junction with the back surface electrode CE in the present embodiment, the present invention is not limited to this. Instead of the AlNiSi layer ML, a layer may be applicable, the layer containing, for example, aluminum (Al), silicon (Si), and at least one type of metal having a lower reflectance on a laser wavelength region (a wavelength region of a visible light beam) than that of aluminum (Al). Here, the metal having the lower reflectance on the laser wavelength region (the wavelength region of the visible light beam) than that of aluminum (Al) is, for example, nickel (Ni), titanium (Ti), vanadium (V), molybdenum (Mo), platinum (Pt) or others.

Alternatively, instead of the AlNiSi layer ML, a layer may be applicable, the layer containing, for example, not silicon (Si) but aluminum (Al) and at least one type of metal having a lower reflectance on a laser wavelength region (a wavelength region of a visible light beam) than that of aluminum (Al). This is because short-time heat treatment is allowed for forming a layer containing, for example, aluminum (Al) and nickel (Ni) (hereinafter referred to as an AlNi layer) by a laser annealing process so that it is difficult to cause a spike of aluminum (Al) even if the layer does not contain silicon (Si), although described later in a method of manufacturing the RC-IGBT.

While such an arrangement example as arranging the N+-type layers NL in a matrix form has been described in the present embodiment, adjacent columns of the N+-type layers NL may be arranged to be shifted by a half cycle from each other. And, the N+-type layers NL may not be arranged by the same interval.

While the shape of the N+-type layer NL is a circular shape in a plan view in the present embodiment, the present invention is not limited to this. For example, the shape of the N+-type layer may be a trapezoid, a rectangle, or a quadrangle.

<<As to Characteristics of Configuration of RC-IGBT on Side Closer to Back Surface Electrode Side and its Effect>>

As illustrated in FIG. 1 described above, the present embodiment has a feature of formation of a layer containing aluminum (Al), silicon (Si), and at least one type of metal having a lower reflectance on a laser wavelength region (a wavelength region of a visible light beam) than that of aluminum (Al) between the back surface electrode CE and the P-type layer PL, the N+-type layer NL, which have been formed in the back surface Sb of the semiconductor substrate SB.

The layer containing aluminum (Al), silicon (Si), and at least one type of metal having the lower reflectance on the laser wavelength region (the wavelength region of a visible light beam) than that of aluminum (Al) is, for example, the AlNiSi layer ML. Thus, a favorable ohmic junction of the back surface electrode CE with both the P-type layer PL and the N+-type layer NL formed in the back surface Sb of the semiconductor substrate SB can be formed.

Furthermore, the present embodiment has a feature of application of a laser annealing process in a short time capable of local heating on the back surface Sb of the semiconductor substrate SB for forming the AlNiSi layer ML.

Hereinafter, a method of forming the AlNiSi layer ML and a technique for forming the ohmic junction with both the P-type layer PL and the N+-type layer NL will be described in detail so as to define characteristics of a configuration of the RC-IGBT on the side closer to the back surface electrode CE according to the present embodiment and define its effect.

(1) As to Method of Forming AlNiSi Layer

FIG. 3A is a schematic view obtained when the P-type layer PL and the N+-type layer NL are formed in the semiconductor substrate SB on the side closer to the back surface Sb, an aluminum (Al) alloy film containing silicon (Si) (hereinafter referred to as an AlSi film) F1 is further formed on the back surface Sb of the semiconductor substrate SB by, for example, a sputtering method, and then, a laser annealing process is performed to the AlSi film F1. In the drawing, a solid line indicates an incident wave, and a dotted line indicates a reflected wave. The content of silicon (Si) in the AlSi film F1 is, for example, about 0.1 to 1.5%, and the thickness of the AlSi film F1 is, for example, about 50 to 100 nm.

As illustrated in FIG. 3A, in a laser wavelength (e.g., λ=527 nm) in a wavelength region of a visible light beam, a laser beam is reflected (a reflectance: about 90% or more) on a surface of the AlSi film F1. Therefore, even if the laser annealing process is performed to the AlSi film F1, the heat treatment in a short time cannot be applied thereto.

FIG. 3B is a schematic view obtained when the P-type layer PL and the N+-type layer NL are formed in the semiconductor substrate SB on the side closer to the back surface Sb, the AlSi film F1 and a nickel (Ni) film (hereinafter referred to as a Ni film) F2 are sequentially formed on the back surface Sb of the semiconductor substrate SB by, for example, a sputtering method, and then, a laser annealing process is performed to a stacked film formed of the AlSi film F1/the Ni film F2. In the drawing, a solid line indicates an incident wave, and a dotted line indicates a reflected wave. The content of silicon (Si) in the AlSi film F1 is, for example, about 0.1 to 1.5%, the thickness of the AlSi film F1 is, for example, about 50 to 100 nm, and the thickness of the Ni film F2 is, for example, about 50 nm.

As illustrated in FIG. 3B, the Ni film F2 has a lower reflectance (a higher absorption coefficient) on a laser wavelength (e.g., λ=527 nm) in a wavelength region of a visible light beam than that of the AlSi film F1. Therefore, by the laser annealing process, the heat treatment can be applied to the stacked film formed of the AlSi film F1/the Ni film F2 in a short time, e.g., on the order of microseconds.

FIG. 4 is an analysis diagram of Auger Electron Spectroscopy on the side of the back surface Sb of the semiconductor substrate SB obtained when the laser annealing process is applied to the stacked film formed of the AlSi film F1/the Ni film F2 and formed on the back surface Sb of the semiconductor substrate SB as illustrated in FIG. 3B.

As illustrated in FIG. 4, silicon (Si) constituting the semiconductor substrate SB, aluminum (Al) and silicon (Si) constituting the AlSi film F1, and nickel (Ni) constituting the Ni film F2 are thermally diffused into one another by the laser annealing process so that the AlNiSi layer ML is formed in contact with the back surface Sb of the semiconductor substrate SB.

(2) As to Technique for Forming Ohmic Junction

Next, a laser annealing condition used in the formation of the AlNiSi layer ML on the back surface Sb of the semiconductor substrate SB and a relation between a saturation voltage (VCE (sat): a voltage drop between a collector and an emitter) of the IGBT and a forward voltage drop (VF) of the embedded diode will be described. Note that the following is the explanation with reference to FIG. 1 and FIGS. 3A and 3B described above.

FIG. 5 is a graph illustrating a relation between a forward voltage drop (VF) of the embedded diode and an energy density for the laser annealing process. After the N$^+$-type layer NL is formed in the semiconductor substrate SB on the side closer to the back surface Sb, the AlSi film F1 or the stacked film of the AlSi film F1/the Ni film F2 is formed on the back surface Sb of the semiconductor substrate SB, and the laser annealing process is performed to them while changing the energy density of each of them.

As illustrated in FIG. 5, in the case of only the AlSi film F1, the forward voltage drop (VF) hardly changes while the energy density increases and decreases. This is because a laser beam is reflected thereon so that heat is not absorbed as described above (see FIG. 3A, described above).

On the other hand, in the case of the stacked film formed of the AlSi film F1/the Ni film F2, the forward voltage drop (VF) changes while the energy density increases and decreases. Particularly when the energy density is about medium, the forward voltage drop (VF) significantly decreases. It is conceivable that this is because heat treatment at an about 400° C. is performed when the energy density is medium, so that the AlNiSi layer ML is formed in contact with the N$^+$-type layer NL to form a favorable ohmic junction with the N$^+$-type layer NL (see FIG. 3B, described above).

Incidentally, as illustrated in FIG. 5, the laser annealing process has optimum conditions. That is, a property of the AlNiSi layer ML is determined by the energy density for laser annealing process, the thickness of the AlSi film F1, the thickness of the Ni film F2, and others. Therefore, it is required to optimize these conditions. However, the conditions differ depending on the area of the N$^+$-type layer NL constituting the embedded diode, the type of the metal to be thermally diffused into the AlSi film F1, a laser annealing device, and others. Therefore, it is difficult to lead the optimum condition in comprehensive consideration of the above-described items.

Therefore, the present inventors have paid attention to the ratio of the number of elements of each of aluminum (Al), nickel (Ni), and silicon (Si) contained in the AlNiSi layer ML. And, the present inventors have studied a relation among the saturation voltage (VCE (sat)) of the IGBT, the forward voltage drop (VF) of the embedded diode, and the ratio of the number of elements of each of aluminum (Al), nickel (Ni), and silicon (Si) contained in the AlNiSi layer ML.

FIG. 6 is a graph illustrating an atomic percent (at %) of each of aluminum (Al), nickel (Ni), and silicon (Si) contained in the AlNiSi layer ML. Here, the AlNiSi layer ML means a layer in an area where the content of silicon (Si) contained in the AlNiSi layer ML is 10% or more and 90% or less (see FIG. 4, described above). Note that a reference character Ref-1 shown in the drawing represents a nickel (Ni) silicide film (hereinafter referred to as an NiSi film), and that a reference character Ref-2 represents an aluminum (Al) alloy film containing silicon (Si) (hereinafter referred to as an AlSi film).

As illustrated in FIG. 6, the ratio of the number of elements of each of aluminum (Al), nickel (Ni), and silicon (Si) contained in the AlNiSi layer ML formed by the laser annealing process is 10 at % or more, although it varies.

TABLE 1

| Each property of RC-IGBT | Measurement Position No. | | | | | | | |
|---|---|---|---|---|---|---|---|---|
| | 1 | 2 | 3 | 4 | 5 | 6 | Ref-1 | Ref-2 |
| IGBT: VCE (sat) | ○ | ○ | ○ | ○ | ○ | ○ | X | ○ |
| Embedded diode: VF | ○ | ○ | ○ | ○ | ○ | ○ | ○ | X |

A table 1 summarizes a relation among a saturated voltage (VCE (sat)) of the IGBT, a forward voltage drop (VF) of the embedded diode, and the ratio of the number of elements of each of aluminum (Al), nickel (Ni), and silicon (Si) contained in the AlNiSi layer ML. A symbol "o" in the table 1 means that a contact resistance is low, and a symbol "x" therein means that a contact resistance is high.

As comparison data, the table 1 also shows results obtained when the NiSi film (Ref-1) and the AlSi film (Ref-2) are formed instead of the AlNiSi layer ML. The NiSi film (Ref-1) has a composition of nickel (Ni): 50 at % and silicon (Si): 50 at % as illustrated in FIG. 6, and the AlSi film (Ref-2) has a composition of aluminum (Al): 50 at % and silicon (Si): 50 at % as illustrated in FIG. 6.

As clearly seen from the table 1, if the ratio of the number of elements of each of aluminum (Al), nickel (Ni), and silicon (Si) is 10 at % or more, a low contact resistance can be obtained. Thus, favorable characteristics can be obtained for both of the saturated voltage (VCE (sat)) of the IGBT and the forward voltage drop (VF) of the embedded diode.

On the other hand, in the NiSi film (Ref-1), a contact resistance is high in the IGBT. This is because the impurity concentration of the N$^+$-type layer NL formed on the back surface Sb of the semiconductor substrate SB is as high as $1 \times 10^{20}$ cm$^{-3}$ while the impurity concentration of the P-type layer PL formed on the back surface Sb of the semiconductor substrate SB is as low as $1 \times 10^{17}$ cm$^{-3}$. That is, this is because an ohmic junction with the P-type layer PL having a low concentration is not formed in the NiSi film.

In the AlSi film (Ref-2), a contact resistance is high in the embedded diode. This is because heat treatment is not performed so that an ohmic junction with the $N^+$-type layer NL is not formed in the AlSi film.

Thus, By setting the ratio of the number of elements of each of aluminum (Al), nickel (Ni), and silicon (Si) contained in the AlNiSi layer ML to 10 at % or more, favorable ohmic junctions of both of the P-type layer PL and the $N^+$-type layer NL, which have been formed on the back surface Sb of the semiconductor substrate SB, can be formed with the back surface electrode CE. Therefore, a high-performance RC-IGBT can be achieved.

(3) Summary

In the RC-IGBT according to the present embodiment, the AlNiSi layer ML (a layer containing aluminum (Al), nickel (Ni), and silicon (Si)) is formed between the back surface Sb of the semiconductor substrate SB and the back surface electrode CE as illustrated in FIG. 1 described above.

When the AlNiSi layer ML is formed between the $N^+$-type layer NL and the back surface electrode CE in the embedded diode, a favorable ohmic junction can be obtained between the $N^+$-type layer NL and the back surface electrode CE as illustrated in FIG. 5 and the table 1 described above. Similarly, when the AlNiSi layer ML is formed between the P-type layer PL and the back surface electrode CE also in the IGBT, a favorable ohmic junction can be obtained between the P-type layer PL and the back surface electrode CE as shown in the table 1 described above.

Therefore, in the RC-IGBT, a favorable ohmic junction of both the $N^+$-type layer NL and the P-type layer PL, which have been formed on the back surface Sb of the semiconductor substrate SB, with the back surface electrode CE can be formed.

As illustrated in FIG. 3B, the AlNiSi layer ML can be formed by forming the stacked film of the AlSi film F1/the Ni film F2 on the back surface Sb of the semiconductor substrate SB and performing a laser annealing process to this stacked film of the AlSi film F1/the Ni film F2. Therefore, the AlNiSi layer ML can be simultaneously formed on both surfaces of the P-type layer PL and the $N^+$-type layer NL.

Furthermore, the laser annealing process can be performed in a short time (e.g., on the order of microseconds) and can achieve local heating of the back surface Sb of the semiconductor substrate SB (in the vicinity of the back surface Sb of the semiconductor substrate SB). Thus, deposition of silicon (Si) contained in the AlSi film F1 is suppressed. Therefore, it can be prevented to change the type of the $N^+$-type layer NL into a P-type due to the diffusion of aluminum (Al) into a deposition site. Further, occurrence of a spike of aluminum (Al) is suppressed. Therefore, increase in a breakdown voltage leakage current can be prevented. Further, warpage of a semiconductor wafer is suppressed. Therefore, increase in a breakdown voltage leakage current due to a stress can be prevented.

<<Method of Manufacturing RC-IGBT>>

A method of manufacturing the RC-IGBT according to the present embodiment will be described in a process sequence with reference to FIGS. 7 to 13. FIG. 7 is a flowchart explaining processes for manufacturing the RC-IGBT according to the present embodiment. FIGS. 8 to 13 are cross-sectional views illustrating the processes for manufacturing the RC-IGBT according to the present embodiment.

First, as illustrated in FIG. 8, a semiconductor substrate SB is prepared. The semiconductor substrate SB is made of, for example, single crystalline silicon (Si), and is formed by using, for example, a Czochralski (CZ) method, a Magnetic Field Applied Czochralski (MCZ) method, a Floating Zone (FZ) method, or an epitaxial growth method. An $N^-$-type layer ND (a drift region) is formed in the entire semiconductor substrate SB.

Next, a trench TR having a predetermined depth is formed on a side closer to a front surface Sa of the semiconductor substrate SB, and then, a gate insulating film GI is formed on an inner wall (a side surface and a bottom surface) of the trench TR. The depth of the trench TR is, for example, about 2 to 10 µm. The gate insulating film GI is made of, for example, oxide silicon ($SiO_2$). Subsequently, a polycrystalline silicon film is filled into the trench TR via the gate insulating film GI, so that a gate electrode GE formed of the polycrystalline silicon film is formed.

Next, P-type impurities are ion-implanted into the front surface Sa of the semiconductor substrate SB, so that a P-type layer PC (a part of a body region) having a predetermined depth is formed from a bottom surface of an $N^+$-type layer NE toward a side closer to a back surface Sb of the semiconductor substrate SB. The depth of the P-type layer PC is formed to be smaller than the depth of the trench TR.

Next, N-type impurities are ion-implanted into the front surface Sa of the semiconductor substrate SB, so that the $N^+$-type layer NE (an emitter region) having a predetermined depth is formed from the front surface Sa of the semiconductor substrate SB. The depth of the $N^+$-type layer NE is formed to be smaller than the depth of the trench TR. Subsequently, an insulating film IF is formed on the front surface Sa of the semiconductor substrate SB. The insulating film IF is made of, for example, silicon oxide ($SiO_2$).

Next, an insulating film IF in a contact region to which a front surface electrode is connected is removed by etching, and then, the semiconductor substrate SB is removed by etching until the P-type layer PC is exposed. Subsequently, P-type impurities are ion-implanted into the front surface Sa of the semiconductor substrate SB in the contact region, so that a $P^+$-type layer PB (the other part of the body region) is formed in the contact region. The depth of the $P^+$-type layer PB is formed to be larger than the depth of the P-type layer PC and smaller than the depth of the trench TR. Further, a $P^{++}$-type layer PS is formed on an upper part of the $P^+$-type layer PB.

Next, as illustrated in FIG. 9, a barrier metal film BM is formed to cover the $P^{++}$-type layer PS, the $N^+$-type layer NE, and the insulating film IF, and then, a front surface electrode EE (an emitter electrode, an anode electrode) is formed on the barrier metal film BM. The barrier metal film BM is made of, for example, titanium-tungsten (TiW), and the front surface electrode EE is made of, for example, an aluminum (Al) alloy containing silicon (Si).

Next, as illustrated in FIG. 10, the back surface Sb of the semiconductor substrate SB is then ground so as to thin the semiconductor substrate SB to have a predetermined depth (step S1 illustrated in FIG. 7). The thickness of the semiconductor substrate SB is, for example, about 40 to 200 µm. Subsequently, a crushing layer on the back surface Sb of the semiconductor substrate SB is removed by, for example, spin etching using a hydrofluoric nitric acid (step S2 illustrated in FIG. 7).

Next, N-type impurities (e.g., phosphorus (P)) are ion-implanted into the entire back surface Sb of the semiconductor substrate SB to form an N-type layer NF (a field stop region) having a predetermined depth from the back surface Sb of the semiconductor substrate SB (step S3 illustrated in FIG. 7). The impurity concentration of the N-type layer NF is, for example, about $1 \times 10^{15}$ to $1 \times 10^{18}$ cm$^{-3}$. Subsequently, P-type impurities (e.g., boron (B)) are ion-implanted into the entire back surface Sb of the semiconductor substrate SB to form a P-type layer PL (a collector region) in a region having a predetermined depth from the back surface Sb of the semiconductor substrate SB and having a smaller depth than the depth of the N-type layer NF (step S4 illustrated in FIG. 7). The impurity concentration of the P-type layer PL is, for example, about $1 \times 10^{16}$ to $1 \times 10^{20}$ cm$^{-3}$, and $1 \times 10^{17}$ cm$^{-3}$ can be exemplified as a typical value.

Next, a resist pattern (illustration is omitted) is formed on the back surface Sb of the semiconductor substrate SB (step S5 illustrated in FIG. 7).

Next, as illustrated in FIG. 11, N-type impurities (e.g., phosphorous (P)) are ion-implanted into the P-type layer PL on the back surface Sb of the semiconductor substrate SB while using the resist pattern as a mask, so that the type of a part of the P-type layer PL is reversed to an N-type to form an N$^+$-type layer NL (step S6 illustrated in FIG. 7). The impurity concentration of the N$^+$-type layer NL is, for example, about $1 \times 10^{18}$ to $1 \times 10^{21}$ cm$^{-3}$, and $1 \times 10^{20}$ cm$^{-3}$ can be exemplified as a typical value.

Next, the resist pattern is removed (step S7 illustrated in FIG. 7), and then, laser annealing process is performed to the semiconductor substrate SB to activate each of the impurities which have been implanted into the semiconductor substrate SB (step S8 illustrated in FIG. 7).

Next, as illustrated in FIG. 12, an AlSi film F1 is formed on the back surface Sb of the semiconductor substrate SB by a sputtering method (step S9 illustrated in FIG. 7). The AlSi film F1 contains, for example, about 0.1 to 1.5% of silicon (Si). The thickness of the AlSi film F1 is, for example, about 25 to 150 nm, and 50 nm can be exemplified as a typical value. Subsequently, an Ni film F2 is formed on the AlSi film F1 by a sputtering method (step S10 illustrated in FIG. 7). The thickness of the Ni film F2 is, for example, about 20 to 100 nm, and 50 nm can be exemplified as a typical value.

Next, as illustrated in FIG. 13, an AlNiSi layer ML contacting both the P-type layer PL and the N$^+$-type layer NL (step S11 illustrated in FIG. 7) by irradiating the back surface Sb of the semiconductor substrate SB with a laser beam (laser annealing process: step S11 illustrated in FIG. 7) to heat the back surface Sb of the semiconductor substrate SB. A laser wavelength for the laser annealing process is, for example, about 500 to 900 nm, and 527 nm can be exemplified as a typical value. An energy density for the laser annealing process is, for example, about 0.6 to 1.2 J/cm$^2$, and a laser irradiation time is, for example, on the order of microseconds.

Although the AlSi film F1 containing silicon (Si) is formed on the back surface Sb of the semiconductor substrate SB at this stage in order to suppress the occurrence of the spike of aluminum (Al), an aluminum (Al) film not containing silicon (Si) may be formed. This is because a heat treatment time is as short as the order of microseconds since the laser annealing process is used for the heat treatment, so that it is difficult to cause the spike of aluminum (Al) even if silicon (Si) is not contained.

Then, a natural oxide film on a surface of the AlNiSi layer ML is removed by, for example, spin etching using hydrofluoric nitric acid (step S12 illustrated in FIG. 7), and then, a back surface electrode CE (a collector electrode, a cathode electrode) is formed on the AlNiSi film ML (step S13 illustrated in FIG. 7). The back surface electrode CE has, for example, a multilayer structure in which an aluminum (Al) alloy layer containing silicon (Si), a titanium (Ti) film, a nickel (Ni) film, and a gold (Au) film are stacked from the side of the AlNiSi layer ML.

The RC-IGBT illustrated in FIG. 1 described above is formed by the foregoing manufacturing processes.

Thus, according to the present embodiment, when the AlNiSi layer ML is formed in contact with the back surface Sb of the semiconductor substrate SB, a favorable ohmic junction of both the P-type layer PL and the N$^+$-type layer NL, which have been formed on the back surface Sb of the semiconductor substrate SB can be formed with the back surface electrode CE. Therefore, a high-performance RC-IGBT can be achieved. Further, the AlNiSi layer ML can be formed by forming the stacked film formed of the AlSi film F1/the Ni film F2 on the back surface Sb of the semiconductor substrate SB and performing the laser annealing process to the stacked film formed of the AlSi film F1/the Ni film F2. Therefore, the ohmic junction can be obtained by using simple manufacturing processes.

<<First Modification>>

An RC-IGBT according to a first modification of the present embodiment will be described with reference to FIG. 14. FIG. 14 is a cross-sectional view of the RC-IGBT according to the first modification of the present embodiment.

The RC-IGBT according to the first modification and the RC-IGBT illustrated in FIG. 1 described above are different from each other in structures of a back surface P-type layer and a back surface N-type layer which are formed on a back surface of a semiconductor substrate.

In the RC-IGBT illustrated in FIG. 1 described above, the back surface P-type layer is formed of the P-type layer PL having an impurity concentration of, for example, $1 \times 10^{17}$ cm$^{-3}$, and the back surface N-type layer is formed of the N$^+$-type layer NL having an impurity concentration of, for example, $1 \times 10^{20}$ cm$^{-3}$.

In the RC-IGBT according to the first modification, as illustrated in FIG. 4, the back surface N-type layer is formed of a first N$^+$-type layer NL1 having a first impurity concentration (of, for example, $1 \times 10^{20}$ cm$^{-3}$) and a second N-type layer NL2 having a second impurity concentration lower than the first impurity concentration. And, the back surface P-type layer is formed of a first P-type layer PL1 having a third impurity concentration (of, for example, $1 \times 10^{17}$ cm$^{-3}$) and a second P$^-$-type layer PL2 having a fourth impurity concentration lower than the third impurity concentration.

When the second N-type layer NL2 having a relatively low impurity concentration is formed and when a region not functioning as a part of a diode is provided, an implantation efficiency on a back surface of the RC-IGBT can be controlled. Thus, the speed of recovery can be increased.

When the second P$^-$-type layer PL2 having a relatively low impurity concentration is formed in a peripheral region on the outer periphery of a semiconductor chip, a carrier component caused during an ON operation of an IGBT can be reduced. Thus, a Reverse Bias Safe Operating Area (RBSOA) breakdown voltage of the RC-IGBT can be improved.

<<Second Modification>>

A power Metal Oxide Semiconductor Field Effect Transistor (MOSFET) according to a second modification of the present embodiment will be described with reference to FIG. 15. FIG. 15 is a cross-sectional view of the power MOSFET according to the second modification of the present embodiment.

As illustrated ion FIG. 15, in the power MOSFET, an AlNiSi layer ML may be formed in contact with an N$^+$-type layer NC formed on a back surface Sb of a semiconductor SB. When the AlNiSi layer ML is formed in contact with the back surface Sb of the semiconductor substrate SB, an ohmic junction with a back surface electrode CE can be formed.

<<Third Modification>>

A diode according to a third modification of the present embodiment will be described with reference to FIG. 16. FIG. 16 is a cross-sectional view of the diode according to the third modification of the present embodiment.

As illustrated in FIG. 16, in the diode, an AlNiSi layer ML may be formed in contact with an N$^+$-type layer NC formed on a back surface Sb of a semiconductor substrate SB. When the AlNiSi layer ML is formed in contact with the back surface Sb of the semiconductor substrate SB, an ohmic junction with a back surface electrode CE can be formed.

While an NiSi film BL2 is generally formed in contact with a back surface Sb of a semiconductor substrate SB as illustrated in FIG. 17B described above, a shape of a breakdown voltage leakage current tends to have a two-step staircase waveform due to a stress of the NiSi film BL2. However, when an AlNiSi layer ML is formed in contact with the back surface Sb of the semiconductor substrate SB, the stress is relaxed so that the breakdown voltage leakage current can be reduced.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A semiconductor device comprising:
   a semiconductor substrate having a first main surface and a second main surface on an opposite side to the first main surface;
   a first electrode formed on a side closer to the first main surface;
   a second electrode formed on a side closer to the second main surface;
   a first semiconductor layer of a first conductivity type which is formed in a first region in the semiconductor substrate so as to be exposed to the second main surface;
   a second semiconductor layer of a second conductivity type different from the first conductivity type, which is formed in a second region different from the first region in the semiconductor substrate so as to be exposed to the second main surface;
   a junction layer which is formed in contact with the first semiconductor layer and the second semiconductor layer and which contains aluminum, silicon, and a first metal having a lower reflectance on a wavelength of visible light beam than a reflectance of the aluminum; and
   the second electrode formed in contact with the junction layer,
   wherein the first metal is nickel, and
   wherein the junction layer includes 10 at % or more of each of the aluminum, the silicon, and the nickel.

2. The semiconductor device according to claim 1, wherein a thickness of the junction layer is 100 nm or more and 500 nm or less.

3. The semiconductor device according to claim 1, wherein the first conductivity type is a P-type, and the second conductivity type is an N-type, and an impurity concentration of the second semiconductor layer is higher than an impurity concentration of the first semiconductor layer.

4. The semiconductor device according to claim 3, wherein a plurality of the second semiconductor layers are arranged at an equal interval from one another in the first semiconductor layer in a plan view, and the second semiconductor layer has a circular shape in a plan view.

5. The semiconductor device according to claim 1, further comprising:
   a third semiconductor layer of the first conductivity type which is formed in the semiconductor substrate so as to have a first depth from the first main surface;
   a fourth semiconductor layer of the second conductivity type which is formed in a third semiconductor layer so as to have a second depth smaller than the first depth from the first main surface;
   a fifth semiconductor layer of the second conductivity type which is formed in the semiconductor substrate between the third semiconductor layer and the first and second semiconductor layers;
   a trench which is formed in the semiconductor substrate so as to penetrate the fourth semiconductor layer and the third semiconductor layer from the first main surface and which reaches the fifth semiconductor layer;
   a third electrode formed inside the trench through an insulating film; and
   the first electrode electrically connected to the third semiconductor layer and the fourth semiconductor layer.

6. A semiconductor device comprising:
   a semiconductor substrate having a first main surface and a second main surface on an opposite side to the first main surface;
   a first electrode formed on a side closer to the first main surface;
   a second electrode formed on a side closer to the second main surface;
   a first semiconductor layer of an N-type conductivity which is formed in the semiconductor substrate so as to be exposed to the second main surface;
   a junction layer which is formed in contact with the first semiconductor layer and which contains aluminum, silicon, and a first metal having a lower reflectance on a wavelength of visible light beam than a reflectance of the aluminum; and
   the second electrode formed in contact with the junction layer,
   wherein the first metal is nickel, and
   wherein the junction layer includes 10 at % or more of each of the aluminum, the silicon, and the nickel.

7. The semiconductor device according to claim 6, wherein a thickness of the junction layer is 100 nm or more and 500 nm or less.

8. The semiconductor device according to claim 6, further comprising:
   a second semiconductor layer of the N-type conductivity which is formed in the semiconductor substrate so as to be exposed to the first main surface;
   a third semiconductor layer of a P-type conductivity which is formed in the semiconductor substrate between the first semiconductor layer and the second semiconductor layer;

a fourth semiconductor layer of the N-type conductivity which is formed in the semiconductor substrate between the first semiconductor layer and the third semiconductor layer;

a trench which is formed in the semiconductor substrate so as to penetrate the second semiconductor layer and the third semiconductor layer from the first main surface and which reaches the fourth semiconductor layer;

a third electrode formed inside the trench through an insulating film; and the first electrode electrically connected to the second semiconductor layer.

9. The semiconductor device according to claim 6, further comprising:

a second semiconductor layer of a P-type conductivity which is formed in the semiconductor substrate between the first semiconductor layer and the first main surface so as to be exposed to the first main surface; and the first electrode formed in contact with the second semiconductor layer.

* * * * *